US007548079B2

(12) United States Patent
Teraishi

(10) Patent No.: US 7,548,079 B2
(45) Date of Patent: Jun. 16, 2009

(54) SEMICONDUCTOR DEVICE INCLUDING ANALOG VOLTAGE OUTPUT DRIVER LSI CHIP HAVING TEST CIRCUIT

(75) Inventor: Toshio Teraishi, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 0 days.

(21) Appl. No.: 12/153,950

(22) Filed: May 28, 2008

(65) Prior Publication Data

US 2008/0265930 A1 Oct. 30, 2008

Related U.S. Application Data

(63) Continuation of application No. 10/617,817, filed on Jul. 14, 2003, now abandoned.

(30) Foreign Application Priority Data

Oct. 1, 2002 (JP) ............................ 2002-288530

(51) Int. Cl.
*G01R 31/02* (2006.01)

(52) U.S. Cl. ...................................................... 324/755

(58) Field of Classification Search .................. 324/755
See application file for complete search history.

(56) References Cited

U.S. PATENT DOCUMENTS

| | | | | |
|---|---|---|---|---|
| 4,357,703 | A * | 11/1982 | Van Brunt | 714/733 |
| 4,912,395 | A * | 3/1990 | Sato et al. | 714/719 |
| 5,225,774 | A * | 7/1993 | Imamura | 324/158.1 |
| 6,219,808 | B1 * | 4/2001 | Sengoku | 714/724 |
| 6,476,789 | B1 * | 11/2002 | Sakaguchi et al. | 345/100 |
| 6,519,728 | B2 * | 2/2003 | Tsujii et al. | 714/727 |
| 6,850,085 | B2 * | 2/2005 | Sakaguchi et al. | 324/765 |
| 7,132,841 | B1 * | 11/2006 | Bertin et al. | 324/765 |
| 2002/0109552 | A1 * | 8/2002 | Tran et al. | 331/36 C |

FOREIGN PATENT DOCUMENTS

| | | |
|---|---|---|
| JP | 05-288812 | 11/1993 |
| JP | 10-209201 | 8/1998 |
| JP | 10-335375 | 12/1998 |
| JP | 11-067845 | 3/1999 |
| JP | 2000-131393 | 5/2000 |
| JP | P2000-131393 A | 5/2000 |

* cited by examiner

*Primary Examiner*—Ha Tran T Nguyen
*Assistant Examiner*—Roberto Velez
(74) *Attorney, Agent, or Firm*—Rabin & Berdo, P.C.

(57) ABSTRACT

An LSI chip includes a plurality of output terminals and a test circuit. The test circuit includes a single test signal input terminal, a single test signal output terminal, a shift register, and a plurality of switches. The shift register includes an input terminal, which is connected to the test signal input terminal, output bits of the shift register being equal to a number of the output terminals of the LSI chip, and a voltage level of one of the output bits of the shift register being different from these of other output bits of the shift register in response to a clock pulse. Each switch includes an input terminal, an output terminal and a control terminal. A number of the switches is equal to the number of the output terminals of the LSI chip, each input terminal of the switches is connected to one of the output terminals of the LSI chip, the output terminals of the switches is commonly connected to the test signal output terminal, and each control terminal of each switch is connected to one of the output bits of the shift register.

4 Claims, 6 Drawing Sheets

SEMICONDUCTOR DEVICE INCLUDING ANALOG VOLTAGE OUTPUT DRIVER LSI CHIP HAVING TEST CIRCUIT

CROSS-REFERENCE TO RELATED APPLICATION

This application claims the priority benefit of Japanese Patent Application No. 2002-288530, filed Oct. 1, 2002, the entire disclosure of which is incorporated herein by reference. This application is a continuation of applicant's application Ser. No. 10/617,817, filed Jul. 14, 2003 now abandoned.

BACKGROUND OF THE INVENTION

1. Field of the Invention

The invention relates to an analog voltage output driver LSI chip having a plurality of output channels, such as a TFT source driver LSI chip specifically, relates to an analog voltage output driver LSI chip including a test circuit therein.

2. Description of the Related Art

A TFT source driver device used in an LCD panel typifies an analog voltage output driver having a plurality of output channels. Such a TFT source driver device is a multiple output channel analog voltage output driver device having few hundreds of analog voltage output terminals for graduation display.

To manufacture the TFT source driver device, a TFT source driver LSI chip is assembled in a user area of a chip carrier, such as a carrier tape or a carrier film. The chip carrier includes input leads, output leads, and test pads, each of which is connected to one of the output leads. The input leads and the output leads are disposed in the user area and extended outside of the user area. Each of the input terminals of the TFT source driver LSI chip is connected to one of the input leads, and each of the output terminals of the TFT source driver LSI chip is connected to one of the output leads. The test pads are formed outside the user area, and each pad is connected to one of the output leads, as described. After the TFT source driver LSI chip is assembled on the chip carrier, the TFT source driver LSI chip is tested. The test is performed by contacting a probe needle of a manipulator to the test pads one by one. Since each test pad has an area larger than that of each output terminal, it is not so difficult to contact the needle to the test pads. After the test has been completed, the user area is clipped out of the chip carrier in order to form a TFT source driver device as a tape-carrier-package (TCK) or a chip-on-film (COF). The structures of the TCK and the COF are basically the same while the materials of their chip carriers are different to each other.

The TFT source driver device having the TFT source driver LSI chip that is assembled on the chip carrier is manufactured in the process described above. Then, the TFT source driver device is mounted on a TFT LCD panel or its printed substrate.

According to the TFT source driver device described above, since the test pads are formed outside the user area, the TFT source driver LSI chip cannot be tested using the test pads, which are disposed outside the user area of the chip carrier, because the TFT source driver LSI chip mounted in the user area is clipped out of the chip carrier on which the test pads are disposed. Thus, when it is necessary to evaluate or analyze the TFT source driver device, it is required to contact the probe needle of the manipulator to the output leads one by one. Thus, when there are three hundred eighty four (384) output leads, the probe needle of the manipulator should be contacted to the output leads 384 times. Further, the pitch between the output leads is so close, for example 80 μm, that it is not easy to make a contact of the probe needle to all of the output leads accurately.

SUMMARY OF THE INVENTION

An objective of the invention is to resolve the above-described problem and to provide an analog voltage output driver LSI chip including a test circuit therein in order to evaluate its electric characteristics easily.

The objective is achieved by the LSI chip having a plurality of output terminals and a test circuit, the test circuit including a single test signal input terminal, a single test signal output terminal, a shift register having an input terminal, which is connected to the test signal input terminal, output bits of the shift register being equal to a number of the output terminals of the LSI chip, and a voltage level of one of the output bits of the shift register being different from these of other output bits of the shift register in response to a clock pulse, and a plurality of switches, each of which includes an input terminal, an output terminal and a control terminal, a number of the switches being equal to the number of the output terminals of the LSI chip, each input terminal of the switches being connected to one of the output terminals of the LSI chip, the output terminals of the switches being commonly connected to the test signal output terminal, and each control terminal of each switch being connected to one of the output bits of the shift register.

BRIEF DESCRIPTION OF THE DRAWINGS

The invention will be more particularly described with reference to the accompanying drawings, in which.

DETAILED DESCRIPTION OF THE PREFERRED EMBODIMENTS

In each drawing, the same reference numbers designate the same or similar components.

First Embodiment

Figure 1:
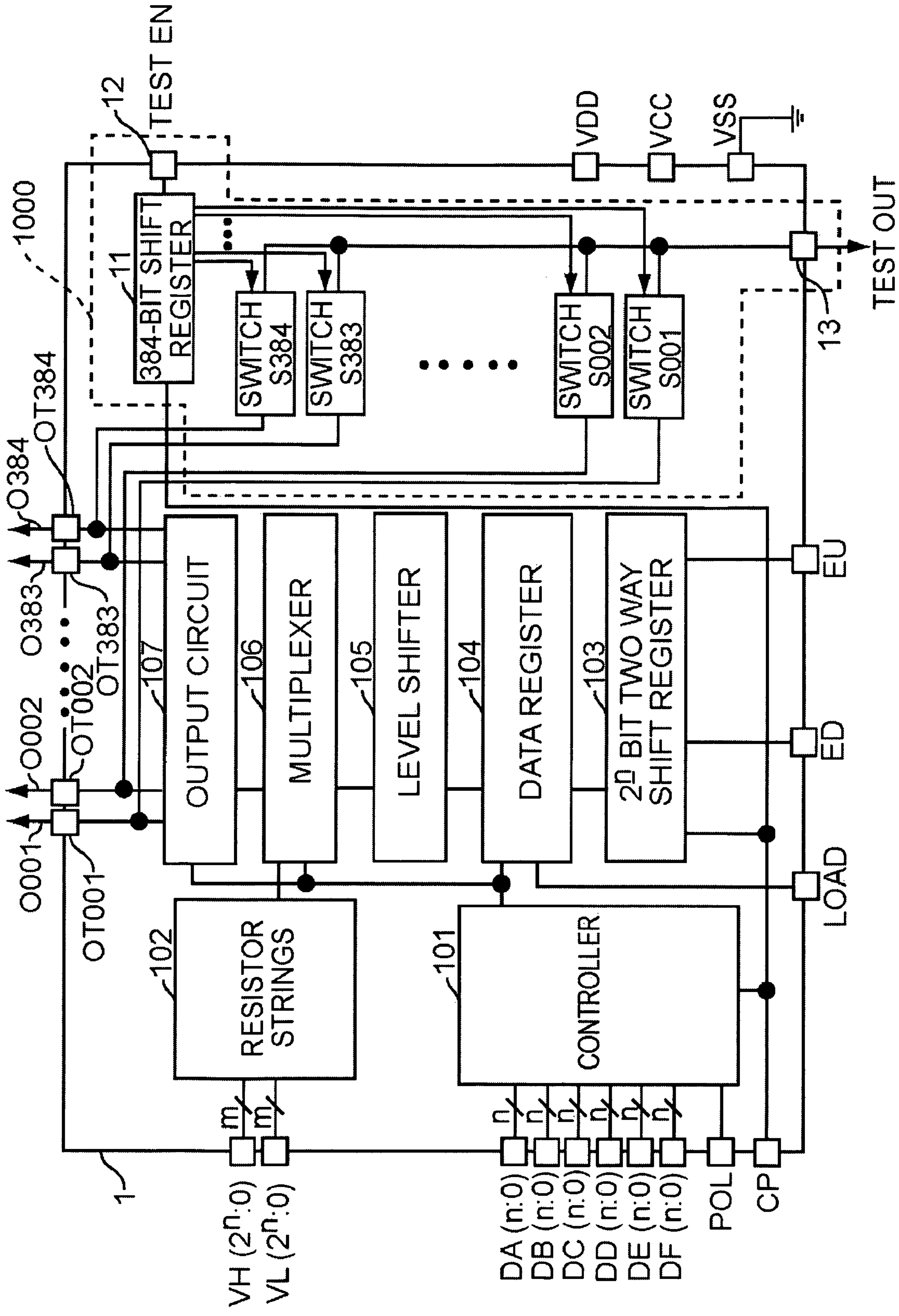
FIG. 1 is a block diagram of a TFT source driver LSI chip, according to a first embodiment of the invention.

FIG. 1 shows a block diagram of a TFT source driver LSI chip 1 (hereinafter, simply referred as a LSI chip 1), which includes three hundred eighty four (384) analog voltage output channels. The LSI chip 1 includes a controller 101, a resistor string 102, a 2n-bit two-way shift register 103, a data register 104, a level shifter 105, a multiplexer 106, an output circuit 107 and a test circuit 1000. The test circuit 1000 includes a 384-bit shift register 11 whose bit number corresponds to a number of the analog voltage outputs O001-O384, a first through 384th switches, a test signal input terminal 12 for receiving a test enable signal TEST EN and a test signal output terminal 13 for outputting the test results TEST OUT.

The LSI chip further includes a Vdd input terminal, a Vcc input terminal, a Vss input terminal, two voltage input terminals for receiving voltages VH (2n:0) and VL(2n:0), respectively, six n-bit graduation data input terminals for receiving n-bit graduation data DA(n:0), DB(n:0), DC(n:0), DD(n:0), DE(n:0) and DF(n:0), a clock pulse input terminal for receiving a clock pulse CP, an output polarity signal input terminal for receiving an output polarity signal POL, a load pulse input terminal for receiving a load pulse LOAD, a down shift signal input terminal for receiving a down shift signal ED, an up shift signal input terminal for receiving a up shift signal EU and the first through the 384 analog voltage output terminals OT001-OT384 for outputting the 384 analog voltage outputs O001-O384, respectively. A number of each voltage input terminal for receiving voltages VH and VL is determined by a number of bits of the graduation data, and a number of each n-bit graduation data input terminal for receiving n-bit graduation data is also determined by a number of bits of the graduation data. Therefore, when 6-bit graduation data (n=6) is used in the LSI chip, twelve voltage input terminals for receiving voltages VH, twelve voltage input terminals for receiving voltages VL, six graduation data input terminals for receiving six-bit graduation data DA, six graduation data input terminals for receiving six-bit graduation data DB, six graduation data input terminals for receiving six-bit graduation data DC, six graduation data input terminals for receiving six-bit graduation data DD, six graduation data input terminals for receiving six-bit graduation data DE and six graduation data input terminals for receiving six-bit graduation data DF are required.

In response to six graduation data DA(n:0), DB(n:0), DC(n:0), DD(n:0), DE(n:0) and DF(n:0) per one output, the controller 101 generates 2n-bit analog graduation data for each output, and outputs the 2n-bit analog graduation data to the two-way shift register 103 in order to control the operations of the 2n-bit two-way shift register 103, the data register 104 and the multiplexer 106, and to control an output inversion function of the output circuit 107 in response to the output polarity signal POL.

The resistor string 102 generates analog graduation voltages corresponding to the n-bit graduation data by a resistor voltage divider, and then outputs the analog graduation voltages to the multiplexer 106.

In response to the clock pulse CP, the two-way shift register 103 accepts six 2n-bit analog graduation data outputted from the controller 101. The two-way shift register 103 can switch its up-shift operation to/from its down shift operation in response to one of the down and up shift signals ED, DU.

The data register 104 latches six 2n-bit analog graduation data stored in the two-way shift register 103 in synchronized with the load pulse LOAD, and then, outputs it to the level shifter 105.

The level shifter 105 transforms voltage amplitude of its input signal. For example, the level shifter 105 transforms a signal having 3 [V] amplitude to a signal having 10 [V] amplitude.

The multiplexer 106 selects one of analog graduation voltages corresponding to 2n-bit analog graduation data per one output, which are latched in the data register 104, in response to the analog graduation voltages generated in the resistor string 102. Then, the selected analog graduation voltage is outputted to the output circuit 107.

The output circuit 107 amplifies its current driving capability, and then, outputs the analog graduation voltage selected by multiplexer 106 as the first through 384th analog voltage outputs O001-O384

The 384-bit shift register in the test circuit 1000 is enabled during a test mode that the test enable signal TEST EN is inputted to the test signal input terminal 12. In the first embodiment, when the test enable signal TEST EN having an H level is inputted to the test circuit 1000, the LSI chip 1 becomes the test mode. During the test mode, the 384-bit shift register 11 shifts its data for one bit in synchronized with the clock pulse CP, and, therefore, changes one bit of 384 bits to “1” (or the H level) sequentially in response to the clock pulse CP. On the other hand, the 384-bit shift register 11 in the test circuit 1000 is disabled during a operation mode. In the first embodiment, when the test enable signal TEST EN having an L level is inputted to the test circuit 1000, the LSI chip 1 becomes the operation mode. During the operation mode, the 384-bit shift register changes all 384 bits to “0” (or the L level).

Each switch Sn (n=001 through 384) is individually activated by the n-bit output from the 384-bit shift register 11. A control terminal of each switch S001-S384 is connected to one of 384 output terminals of the 384-bit shift register 11. That is, when the output at the n-bit is “1” (or the H level), the switch Sn (n=bit number) turns on so that the switch Sn makes its input terminal connect to its output terminal, electrically. When the output at the n-bit is “0” (or the L level), the switch Sn (n=bit number) turns off so that the switch Sn makes the connection between its both input and output terminals disconnect. The input terminal of each switch S001-S384 is connected to one of the analog voltage outputs O001-O384. The output terminals of all switches S001-S384 are commonly connected to the test signal output terminal 13 for outputting the test result TEST OUT.

Figure 2:
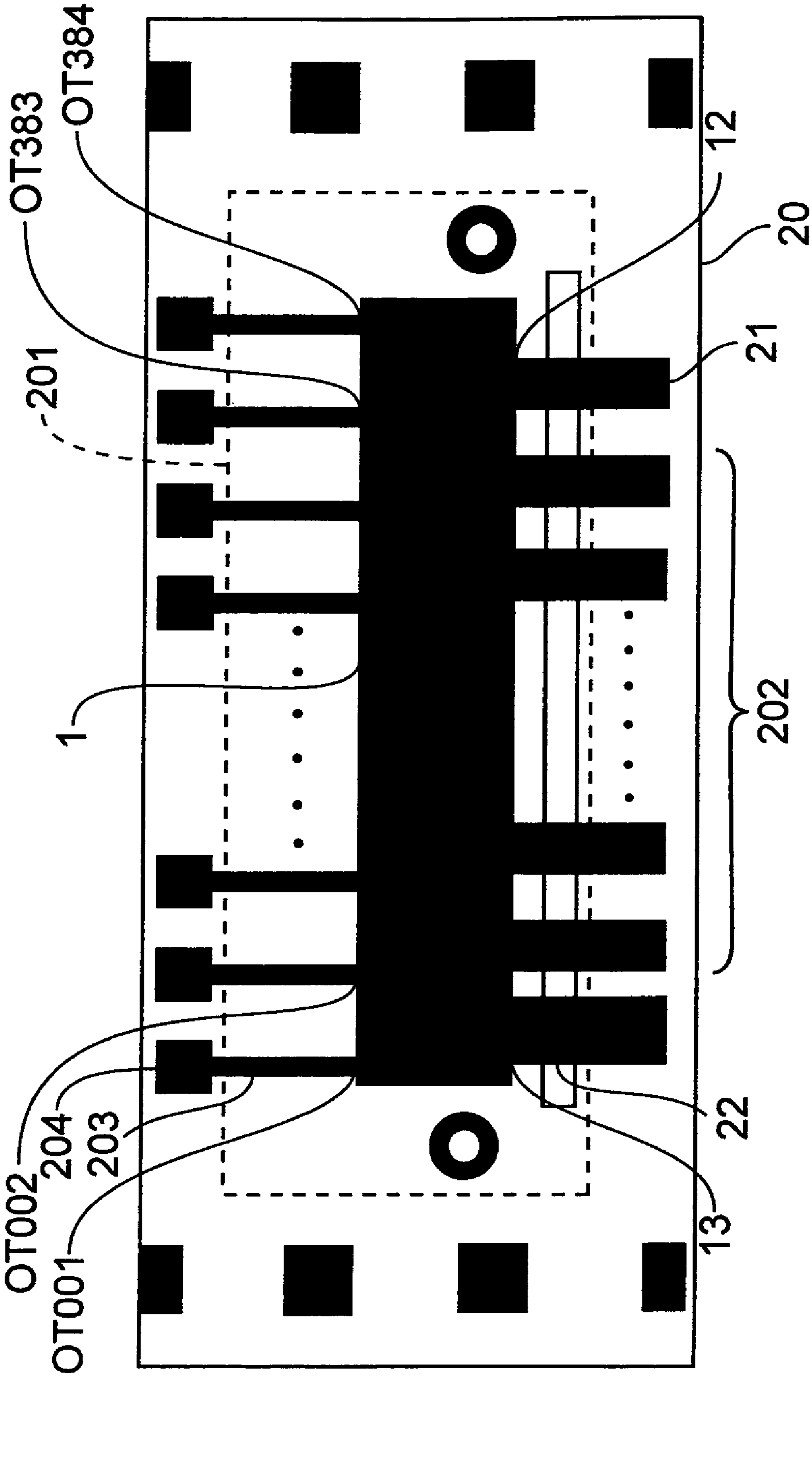
FIG. 2 is an upper view of a chip carrier on which the TFT source driver LSI chip is mounted in user area, according to the first embodiment.

The TFT source driver device having the LSI chip 1 described above is formed in the following process, with reference to FIG. 2. FIG. 2 is an upper view of a chip carrier 20 on which the TFT source driver LSI chip 1 is mounted in a user area 201.

The chip carrier 20 includes a plurality of input leads 202, each of which is connected to one of input terminals of the LSI chip 1, a plurality of output leads 203, each of which is connected to one of the output terminals OT001-OT384 of the LSI chip 1, a plurality of test pads 204, each of which is connected to one of the output leads 203, a single test signal input lead 21, which is connected to the test signal input terminal 12 of the LSI chip 1 for the test enable signal TEST EN and a single test signal output lead 22, which is connected to the test signal output terminal 13 of the LSI chip 1 for outputting the test result TEST EN. Although the test pads 204 are not required to achieve the invention, the test pads 204 would be useful at the evaluation of the LSI chip 1 before completion of the TFT source driver device. The reason for this is described later.

The input leads 202, the test signal output lead 22 and the test signal input lead 21 are disposed in the user area 201, and are extended in one direction toward outside the user area 201. The output leads 203 are also disposed in the user area 201, and are extended in the other direction toward outside the user area 201. The test pads 204 are disposed outside the user area 201. The input leads 202, the test signal output lead 22 and the test signal input lead 21 are spaced to each other, and the input leads 202 are sandwiched between the test signal output lead 22 and the test signal input lead 21. In other words, the test signal output lead 22 is located at one end, and the test signal input lead 21 is located at the other end.

After the LSI chip 1 is mounted in the user area 201 on the chip carrier 20 and makes necessary connections between its terminals and the leads 22, 21, 202, 203 on the chip carrier 20, the LSI chip 1 is evaluated. The evaluation of the LSI chip 1 is performed by either contacting the test needle to the test pads 204 or using the test signal input lead 21 and the test signal output lead 22. When the test pads 204 is used for the evaluation, an existing test device can be used. When the test signal input lead 21 and the test signal output lead 22 are used for evacuation, the evaluation is performed in a process described later.

After the evaluation is completed, and no defect is found, the user area 201 is clipped out of the chip carrier 20 in order to form a TFT source driver device as a tape-carrier-package (TCK) or a chip-on-film (COF).

As described above and as illustrated in FIG. 2, the test signal input lead 21 and the test signal output lead 22 are disposed in the same side as the input leads 202. A number of the input leads 202 are less than that of the output leads 203 so that the width of each input lead 202 can be set wider that that of each output lead 203. Thus, when the test signal output lead 22 are disposed in the same side as the input leads 202, the test signal output lead 22 having a wide width can be formed so that it is easy to contact the needle of a manipulator to the test signal output lead 22 for the evaluation.

The operation of the test circuit 1000 according of the first embodiment is explained below.

In the test mode, the test enable signal TEST EN having a H level is inputted to the test signal input terminal 12 of the test circuit 1000. While the test enable signal TEST EN having the H level is inputted there, the 384-bit shift register 11 is enabled. Then, the first clock pulse CP is inputted to the 384-bit shift register 11, only the 001-bit output is changed to "1" or "the H level", and the 001-bit output having the H level is inputted to the control terminal of the first switch S001. Thus, the first switch S001 turns on. Since the 384-bit shift register 11 changes only one output of 384 outputs to "1" or "the H level" and maintains other 383 outputs to ""0" or "an L level", the second through 384th switches S002-S384 are maintained in off-state while the first switch S001 turns on.

By turning the first switch S001 on, only the first analog voltage output O001 of 384 analog voltage outputs O001-O384 outputted from the output circuit 107 is outputted to the test signal output terminal 13 of the test circuit 1000 via the first switch S001. As described above, since the test signal output terminal 13 of the test circuit 1000 is connected to the test signal output lead 22, the first analog voltage output O001 appears on the test signal output lead 22.

Next, in response to the second clock pulse CP, the 384-bit shift register 11 shifts its data stored therein, and makes the 001-bit output change to "0" or "the L level", and makes only the 002-bit output change to "1" or "the H level". Thus, the first switch S001 turns off, and only the second switch S002 turns on. Other switches S003-S384 are maintained in off state.

Thus, by turning the second switch S002 on, only the second analog voltage output O002 of 384 analog voltage outputs O001-O384 outputted from the output circuit 107 is outputted to the test signal output terminal 13 of the test circuit 1000 via the second switch S002. As well as the first analog voltage output O001, the second analog voltage output O002 appears on the test signal output lead 22, instead of the first analog voltage output O001.

As well as the operation described above, since the 384-bit shift register 11 shifts its data stored therein one by one in response to the clock pulse CP inputted sequentially, the 384-bit shift register 11 makes its 003-bit output through its 384-bit outputs change to "1" or "the H level", selectively and sequentially, in response to the clock pulse CP. As well as the operation described above, while one of the 384 outputs from the 384-bit shift register 11 is in the H level, other 383 outputs are in the L level. Thus, one of the switches S003-S384 turns on selectively in response to one having the H level of the 384 outputs so that one of the analog voltage outputs O003-O384 outputted from the output circuit 107 is outputted to the test signal output terminal 13 of the test circuit 1000, selectively and sequentially, via one of the switches S003-S384, and then, the analog voltage output on the test signal output terminal 13 appears on the test signal output lead 22.

According to the first embodiment, all analog voltage outputs O001-O0384 outputted from the output circuit 107 can be outputted to the single output lead 22 via the test single output terminal 13, selectively and sequentially, in response to the clock pulse CP by the test circuit 1000. Thus, according to the first embodiment, it is possible to evaluate all analog voltage outputs of the LSI chip 1 on the TFT source driver device sequentially by contacting the needle of the manipulator to the single test single output leads 22, which has the wide width and by contacting another needle to the input lead 21. Thus, it is not necessary to contact the needle of the manipulator to the output leads 203, which are disposed closely, 384 times.

Second Embodiment

A difference between the first embodiment and the second embodiment is that a TFT source driver LSI chip 2 of the second embodiment includes a test circuit 2000, instead of the test circuit 1000 used in the first embodiment. Other components including their connections, structures and functions used in the TFT source driver LSI chip 2 of the second embodiment are the same as or similar to those used in the TFT source driver LSI chip 1 of the first embodiment. Thus, the TFT source driver LSI chip 2 is also mounted in a user area on a chip carrier. After the evaluation of the TFT source driver LSI chip 2 is completed, and no defect is found, the user area is clipped out of the chip carrier in order to form a TFT source driver device as a tape-carrier-package or a chip-on-film.

Figure 3A:
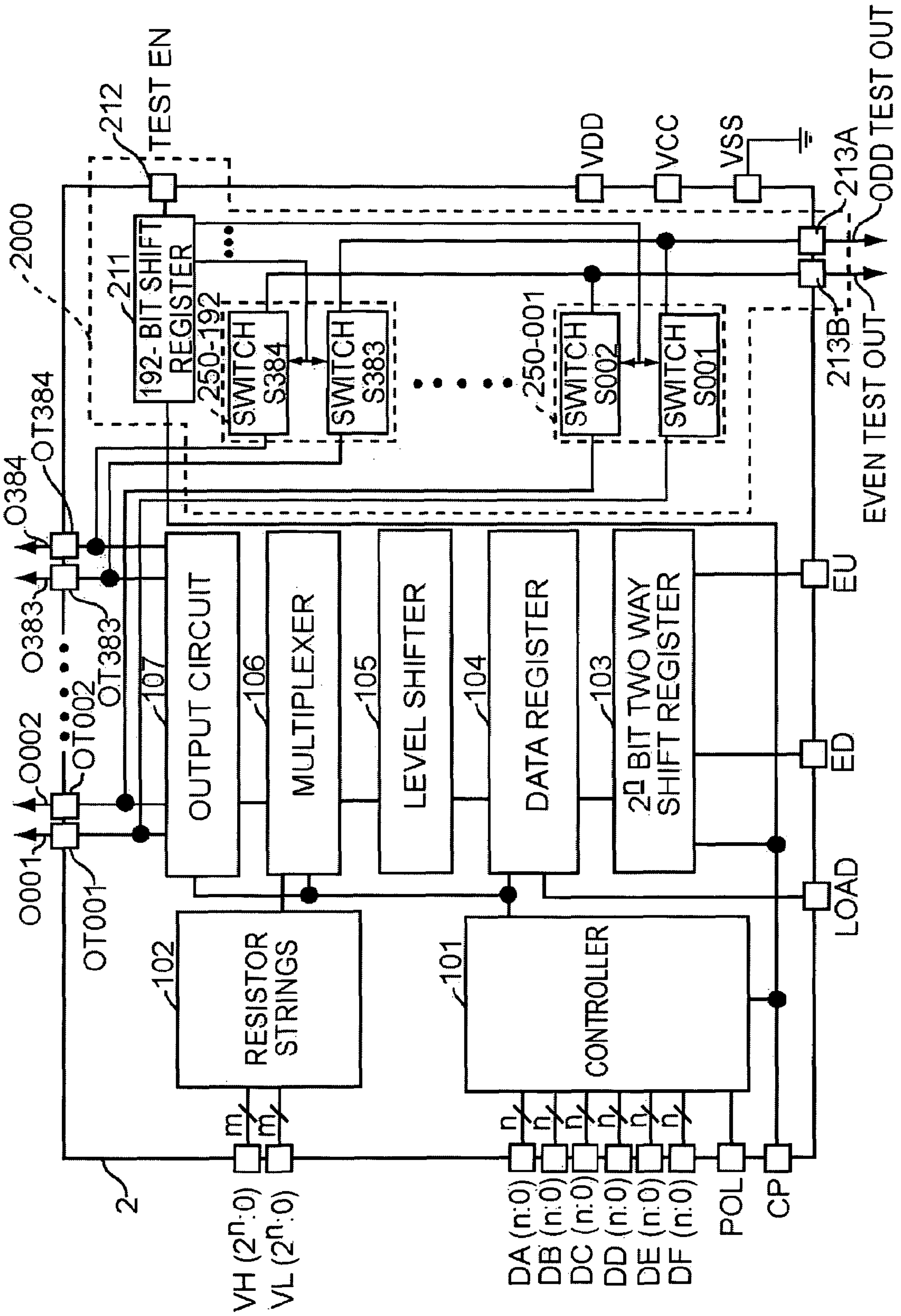
FIG. 3A is a block diagram of a TFT source driver LSI chip, according to a second embodiment of the invention.

FIG. 3A shows a block diagram of a TFT source driver LSI chip 2 (hereinafter, simply referred as a LSI chip 2), which includes three hundred eighty four (384) analog voltage output channels. The LSI chip 2 includes a controller 101, a resistor string 102, a 2n-bit two-way shift register 103, a data register 104, a level shifter 105, a multiplexer 106, an output circuit 107 and the test circuit 2000. The test circuit 2000 includes a 192-bit shift register 211 whose bit number corresponds to a half number of the analog voltage outputs O001-O384, a first through 192nd switches circuits 250-001 through 250-192, a test signal input terminal 212 for receiving a test enable signal TEST EN and an first and a second test signal output terminals 213A, 213B for outputting the test results ODD TEST OUT, EVEN TEST OUT. Each switch circuit 250-*n* includes a first input terminal, a second input terminal, a first output terminal, a second input terminal and a single control terminal.

The 192-bit shift register 211 in the test circuit 2000 is enabled during a test mode that the test enable signal TEST EN is inputted to the test signal input terminal 212. In the second embodiment, when the test enable signal TEST EN having an H level is inputted to the test circuit 2000, the LSI chip 2 becomes the test mode. During the test mode, the 192-bit shift register 211 shifts its data for one bit in synchronized with the clock pulse CP, and changes one bit of 192 bits to "1" (or the H level), selectively and sequentially. On the other hand, the 192-bit shift register 211 in the test circuit 2000 is disabled during a operation mode. In the second embodiment, when the test enable signal TEST EN having an L level is inputted to the test circuit 2000, the LSI chip 2 becomes the operation mode. During the operation mode, the 192-bit shift register 211 changes all 192 bits to "0" (or the L level).

The first switch circuit 250-001 includes a first switch S001 and a second switch S002, each of which includes an input and output terminals and a control terminal. The input terminal of the first switch S001 is connected to the first input terminal of the first switch circuit 250-001, and the input terminal of the second switch S002 is connected to the second input terminal of the first switch circuit 250-001. The output terminal of the first switch S001 is connected to the first output terminal of the first switch circuit 250-001, and the output terminal of the second switch S002 is connected to the second output terminal of the first switch circuit 250-001. The control terminals of the first and the second switches are commonly connected to the control terminal of the switch circuit 250-001. The second through 192nd switch circuit 250-002 though 250-192 are the same structure as the first switch circuit. The first input terminal of each switch circuit 250-001 though 250-192 is connected to one of the analog voltage outputs O(2n−1) (n=001-192), and the second input terminal of each switch circuit 250-001 though 250-192 is connected to one of the analog voltage outputs O(2n) (n=001-192). The first output terminal of each switch circuit 250-001 though 250-192 is connected to the first test signal output terminal 213A, and the second output terminal of each switch circuit 250-001 though 250-192 is connected to the second test signal output terminal 213B. Further, the control terminal of each switch circuit 250-001 though 250-192 is connected to one of the output terminal of the 192-bit shift register 211. For example, the first input terminal of the first switch circuit 250-001 is connected to the analog voltage output terminal OT001, and its output terminal is connected to the first test signal output terminal 213A. The second input terminal of the first switch circuit 250-001 is connected to the analog voltage output terminal OT002, and its output terminal is connected to the second test signal output terminal 213B. As described above, the control terminals of the first and second switches S001, S002 are commonly connected to the control terminal of the first switch circuit 250-001, which is connected to the first bit output terminal of the 192-bit shift register 211. Thus, the first-bit output of the 192-bit shift register 211 is in the H state, both switches S001, S002 turn on. While one output of the 192-bit shift register 211 is in the H state, other outputs are in the L state. Thus, the first-bit output of the 192-bit shift register 211 is in the H state, the first analog voltage output O001 is outputted to the first test signal output terminal 213A via the first switch S001, and the second analog voltage output O002 is outputted to the second test signal output terminal 213B via the first switch S002 simultaneously. The relationship between the third and fourth switches S003, S004 in the second switch circuit 250-002 is similar to the first and second switches S001, S002, and the relationship of the other couples of the switches S(2n−1) and S(2n) (n=3-96) in the other switch circuits 250-002 through 250-192 are the same as these of the first and second switches S001, S002 in the first switch circuit 250-001.

Figure 3B:
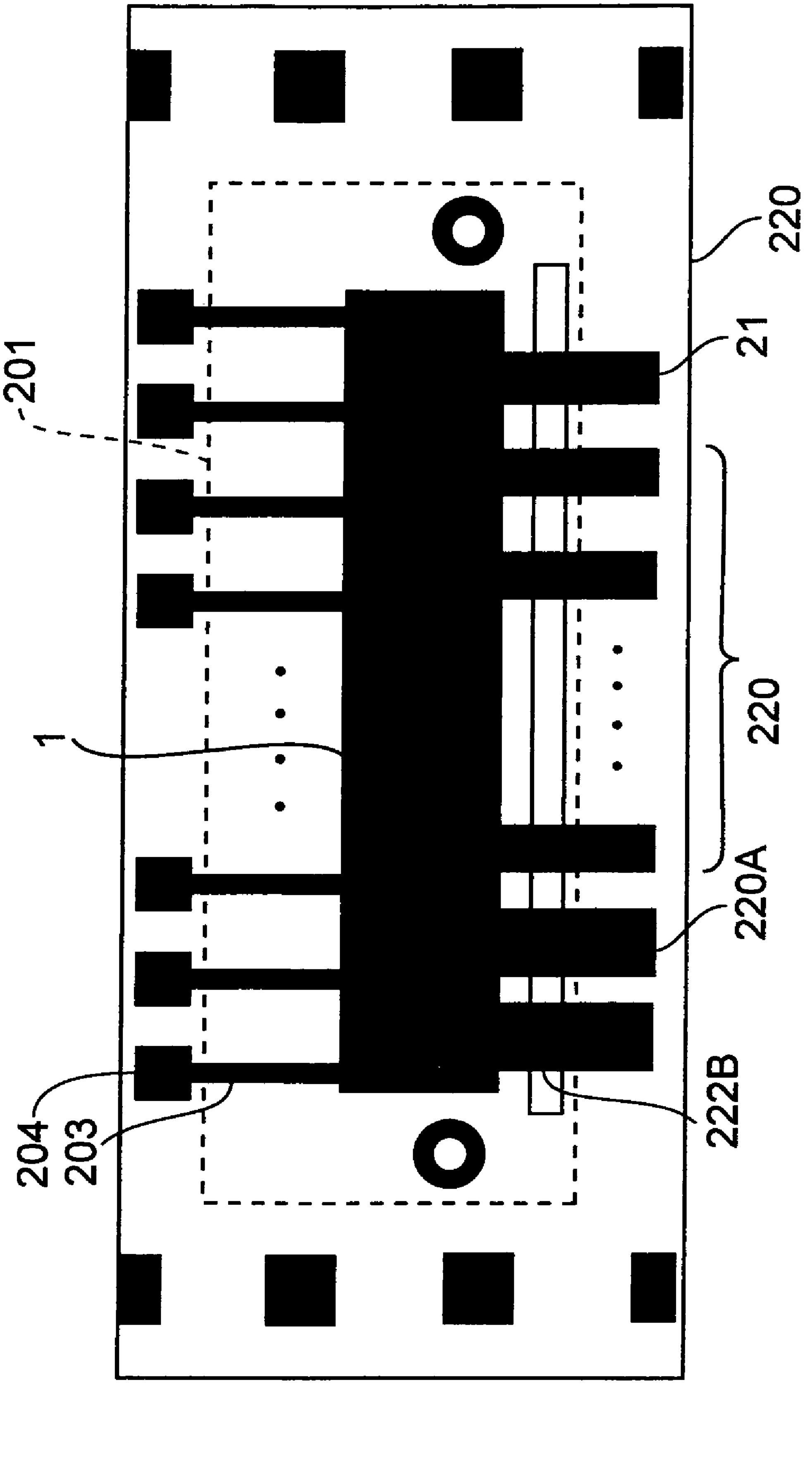
FIG. 3B is an upper view of a chip carrier on which the TFT source driver LSI chip is mounted in user area, according to the second embodiment.

The TFT source driver device having the LSI chip 2 described above is formed in the following process, with reference to FIG. 3B. FIG. 3B is an upper view of a chip carrier 220 on which the TFT source driver LSI chip 2 is mounted in an user area 201. A difference between the chip carrier 220 of the second embodiment and the chip carrier 20 of the first embodiment is that the chip carrier 220 of the second embodiment includes a first test signal output lead 222A and a second test signal output lead 222B, instead of the test signal output lead 22 of the first embodiment. Other components including their connections, structures and functions used in chip carrier 220 of the second embodiment are the same as or similar to these used in chip carrier 20 of the first embodiment.

The first and second test signal output leads 222A, 222B are disposed in the user area 201, and are extended in one direction toward outside the user area 201. As well as the first embodiment, the first and second test signal output leads 222A, 222B are disposed on the same side of the input leads 202 because of the same reasons described in the first embodiment. Thus, the first and second test signal output leads 222A, 222B can be formed with wide widths, respectively. When the LSI chip 2 is mounted in the user area 201 on the chip carrier 220, the first test signal output lead 222A of the chip carrier 220 is connected to the first test signal output terminal 213A of the LSI chip 2, and the second test signal output lead 222B of the chip carrier 220 is connected to the second test signal output terminal 213B of the LSI chip 2.

The operation of the test circuit 2000 according of the second embodiment is explained below.

In the test mode, the test enable signal TEST EN having a H level is inputted to the test signal input terminal 212 of the test circuit 2000. While the test enable signal TEST EN having the H level is inputted there, the 192-bit shift register 211 is enabled. Then, the first clock pulse CP is inputted to the 192-bit shift register 211, only the 001-bit output is changed to "1" or "the H level", and the 001-bit output having the H level is inputted to the control terminals of the first and second switches S001, S002. Thus, the first and second switches S001, S002 turn on. Since the 192-bit shift register 211 changes only one output of 192 outputs to "1" or "the H level" and maintain other 191 outputs to ""0" or "an L level", the third through 384th switches S003-S384 are maintained in off-state while the first and second switches S001, S002 turn on.

By turning the first and second switches S001, S002 on, the first analog voltage output O001 from the output circuit 107 is outputted to the first test signal output terminal 213A of the test circuit 2000 via the first switch S001, and the second analog voltage output O002 from the output circuit 107 is outputted to the second test signal output terminal 213B of the test circuit 2000 via the second switch S002, simultaneously. As described above, since the first test signal output terminal 213A of the test circuit 2000 is connected to the first test signal output lead 222A, the first analog voltage output O001 appears on the first test signal output lead 222A. At the same time, since the second test signal output terminal 213B of the test circuit 2000 is connected to the second test signal output lead 222B, the second analog voltage output O002 appears on the second test signal output lead 222B.

Next, in response to the second clock pulse CP, the 192-bit shift register 211 shifts its data stored therein, and makes the 001-bit output change to "0" or "the L level", and makes only the 002-bit output change to "1" or "the H level". Thus, the first and second switches S001, S002 turn off, and the third and fourth switches S003, S004 turn on. Other switches S005-S384 are maintained in off state.

Thus, by turning the third and fourth switches S003, S004 on, the third analog voltage output O003 from the output circuit 107 is outputted to the first test signal output terminal 213A of the test circuit 2000 via the third switch S003, and the fourth analog voltage output O004 from the output circuit 107 is outputted to the second test signal output terminal 213B of the test circuit 2000 via the fourth switch S004, simultaneously. As well as the first and second analog voltage outputs O001, O002, the third analog voltage output O003 appears on the first test signal output lead 222A, instead of the first analog voltage output O001, and the fourth analog voltage output O004 appears on the second test signal output lead 222B, instead of the second analog voltage output O002.

As well as the operation described above, since the 192-bit shift register 211 shifts its data stored therein one by one in response to the clock pulse CP inputted sequentially, the 192-bit shift register 11 makes its 003-bit output through its 192-bit output change to "1" or "the H level", selectively and sequentially, in response to the clock pulse CP. As well as the operation described above, while one of 192 outputs from the 192-bit shift register 11 is in the H level, other 192 outputs are in the L level. Thus, two switches S(2n−1), S(2n) (N=1-96) turn on, selectively, in response to one output having the H level of the 192 outputs so that two of the analog voltage outputs O005-O384 outputted from the output circuit 107 are outputted to the first and second output terminals 213A, 213B of the test circuit 2000, respectively and selectively via two of the switches S005-S384, and then, the analog voltage outputs on the first and second output terminals 213A, 213B appear on the first and second test signal output leads 222A, 222B, respectively.

According to the second embodiment, in addition to the benefits of the first embodiment, since the bit number of the shift register 211 reduced in half in comparison with the shift register 11 used in the first embodiment, the chip size can be reduced. Further, since the two test results are outputted from the first and second output terminals 213A, 213B, simultaneously, the test time can be reduced in half.

Third Embodiment

Differences between the first or second embodiment and the third embodiment are that a TFT source driver LSI chip 3 of the third embodiment includes a test circuit 3000, instead of the test circuit 1000 or 2000 used in the first or second embodiment, and an output circuit 308. Other components including their connections, structures and functions used in the TFT source driver LSI chip 3 of the third embodiment are the same as or similar to those used in the TFT source driver LSI chip 1 or 2 of the first or second embodiment. Thus, the TFT source driver LSI chip 3 is also mounted in a user area on a chip carrier. Specifically, since a terminal alignment of the TFT source driver LSI chip 3 is the same as that of the TFT source driver LSI chip 1 of the first embodiment, the chip carrier 20 used in the first embodiment can be used in the third embodiment. After the evaluation of the TFT source driver LSI chip 3 is completed, and no defect is found, the user area is clipped out of the chip carrier 20 in order to form a TFT source driver device as a tape-carrier-package or a chip-on-film.

Figure 4:
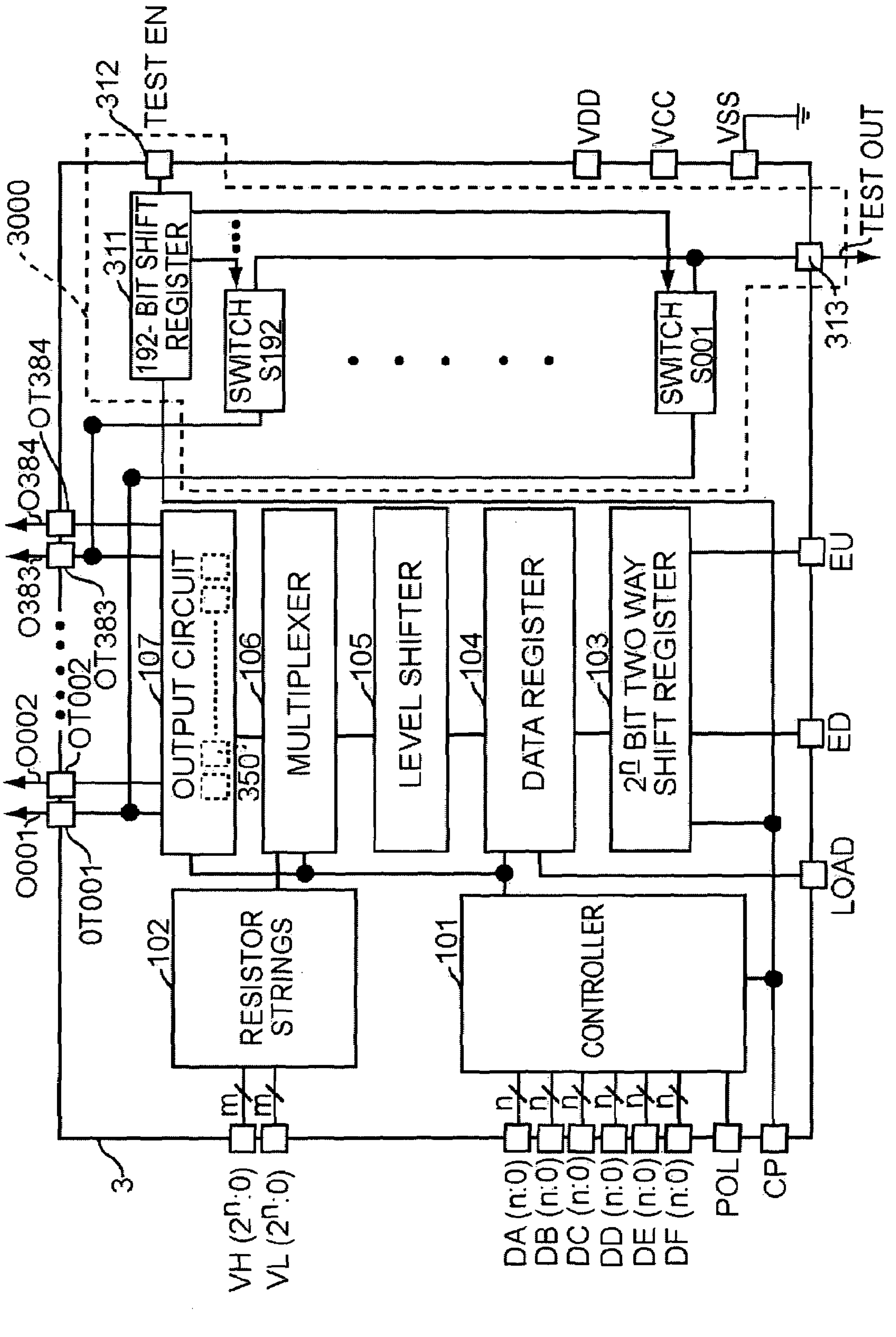
FIG. 4 is a block diagram of a TFT source driver LSI chip, according to a third embodiment of the invention.

FIG. 4 shows a block diagram of a TFT source driver LSI chip 3 (hereinafter, simply referred as a LSI chip 3), which includes three hundred eighty four (384) analog voltage output channels. The LSI chip 3 includes a controller 101, a resistor string 102, a 2n-bit two-way shift register 103, a data register 104, a level shifter 105, a multiplexer 106, the output circuit 308 and the test circuit 3000. The test circuit 3000 includes a 192-bit shift register 311 whose bit number corresponds to a half number of the analog voltage outputs O001-O384, a first through 192nd switches, a test signal input terminal 312 for receiving a test enable signal TEST EN and a test signal output terminal 313 for outputting the test results TEST OUT. The output circuit 308 includes a plurality of signal switching circuits 350 wherein a number them is a half of the analog voltage outputs O001-O384. In this embodiment, the output circuit 308 includes first through 94th signal switching circuits 350. The 192-bit shift register 311 is similar to the 192-bit shift register 211 of the second embodiment. The difference between them is, while each out bit of the 192-bit shift register 311 is connected to one of the control terminals of the switches, each out bit of the 192-bit shift register 211 is connected to one of the control terminals of the switch circuits.

Each switch Sn (n=001 through 192) is individually activated by the n-bit output from the 192-bit shift register 311. As described, a control terminal of each switch S001-S192 is connected to one of 192 output terminals of the 192-bit shift register 311. That is, when the output at the n-bit is "1" (or the H level), the switch Sn (n=bit number) turns on so that the switch Sn makes its input terminal connect to its output terminal, electrically. When the output at the n-bit is "0" (or the L level), the switch Sn (n=001-192) turns off so that the switch Sn makes the connection between its both input and output terminals disconnect. The input terminal of each switch Sn (n=bit number) is connected to one of the analog voltage outputs O(2n−1) (n=001-094). The output terminal of all switches Sn (n=001-192) are commonly connected to the test signal output terminal 313 for outputting the test result TEST OUT.

The TFT source driver device having the LSI chip 3 described above is formed in the same process described in the first embodiment. That is, the LSI chip 3 is mounted in the user area 201 of the chip carrier 20 shown in FIG. 2. As well as the first embodiment, after the LSI chip 3 is mounted in the user area 201 on the chip carrier 20 and makes necessary connections between its terminals and the leads 22, 21, 202, 203 on the chip carrier 20, the LSI chip 3 is evaluated. After the evaluation is completed, and no defect is found, the user area 201 is clipped out of the chip carrier 20 in order to form a TFT source driver device as a tape-carrier-package (TCK) or a chip-on-film (COF).

Figure 5:
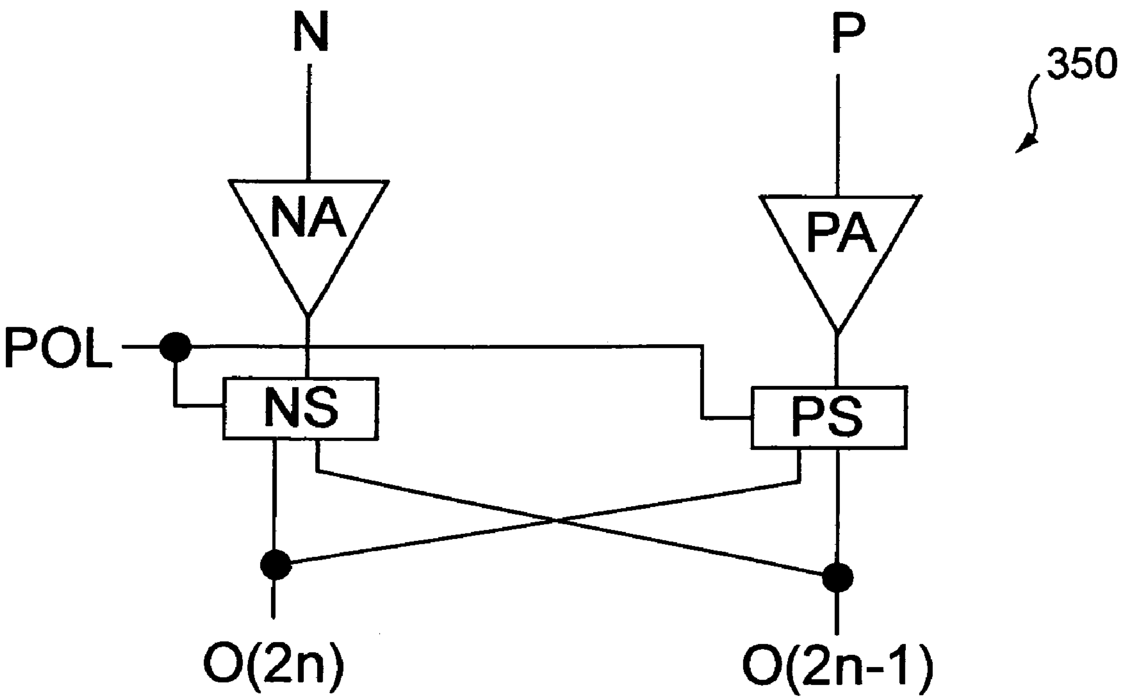
FIG. 5 is a circuit diagram of a signal switching circuit used in an output circuit of the TFT source driver LSI chip of the third embodiment.

The output circuit 308 can switches its odd-bit analog voltage output (2n−1) to/from its even-bit analog voltage output (2n) in response to the output polarity signal POL. FIG. 5 shows the circuit diagram of one of the first signal switching circuits 350 used in the output circuit 308. As described above, there are 94 signal switching circuits 350 in the output circuit 308. Each signal switching circuit 350 includes a first output amplifier PA, a second output amplifier NA, a first selector PS, and a second selector NS.

The first output amplifier PA of each signal switching circuit 350 senses and amplifies one of add-bit decoded outputs P from the multiplexer 106, and outputs it to the first selector PS. The second output amplifier NA of each signal switching circuit 350 senses and amplifies one of even-bit decoded outputs N from the multiplexer 106, and outputs it to the second selector NS.

The first selector PS outputs the decoded output P to one of the odd analog voltage output terminals OT001, OT003 . . . OT381, OT383 for outputting the odd-bit analog voltage outputs O(2n−1) (n=1 through 192) or to one of the even analog voltage output terminals OT002, OT004 . . . OT382, OT384 for outputting the even-bit analog voltage outputs O(2n) (n=1 through 192), in response to the output polarity signal POL. According to the third embodiment, when the output polarity signal POL having "0" or "the L level" is inputted, each decoded output P is outputted to one of the odd analog voltage output terminal OT001, OT003 . . . OT381, OT383, and each decoded output N is outputted to one of the even analog voltage output terminals OT002, OT004 . . . OT382, OT384, respectively. When the output polarity signal POL having "1" or "the H level" is inputted, each decoded output P is outputted to one of the even analog voltage output terminal OT002, OT004 . . . OT382, OT384, and each decoded output N is outputted to one of the odd analog voltage output terminals OT001, OT003 . . . OT381, OT383, respectively. Accordingly, during the operation mode, the output polarity signal POL is always in the L level, and the first analog voltage output O001 is outputted to the first output terminal OT001, and the second analog voltage output O002 is outputted to the second output terminal OT002 in the first signal switching circuit 350. As well as the first signal switching circuit 350, the second through 192nd signal switching circuits 350 output the add-bit analog voltage outputs to the odd output terminal OT003, OT005 . . . OT381, OT 383, and the even-bit analog voltage outputs to the even output terminal OT004, OT006 . . . OT382, OT 384.

On the other hand, during the test mode, the output polarity signal POL having the L level and the H level is applied in order to switch the odd-bit analog voltage output (2n−1) to/from the even-bit analog voltage output (2n) in response to the output polarity signal POL. Thus, all analog voltage outputs can be outputted on the odd analog voltage outputs terminal. Accordingly, by using the output polarity signal POL having the H level and the L level, all 384 analog voltage outputs can be evaluated by measuring the odd-bit analog voltage outputs O(2n−1) appeared on the test signal output lead 22 of the TFT source driver device.

The operation of the test circuit 3000 according of the third embodiment is explained below.

As well as the other embodiments, in the test mode, the test enable signal TEST EN having a H level is inputted to the test signal input terminal 312 of the test circuit 3000. Further, the output polarity signal POL having the L level is inputted to the output circuit 308. Thus, each decoded output P is outputted as the analog voltage outputs O(2n−1).

While the test enable signal TEST EN having the H level is inputted there, the 192-bit shift register 311 is enabled. Then, the first clock pulse CP is inputted to the 192-bit shift register 311, only 001-bit output is changed to "1" or "the H level", and the 001-bit output having the H level is inputted to the control terminal of the first switch S001. Thus, the first switch S001 turns on. Since the 192-bit shift register 311 changes only one output of 192 outputs to "1" or "the H level" and maintains other 191 outputs to ""0" or "an L level", the second through 192nd switches S002-S192 are maintained in off-state while the first switch S001 turns on.

Accordingly, although all odd-bit analog voltage outputs O(2n−1) are inputted to the first through 192nd switches S001-S192, since only the first switch S001 is turning on, the first analog voltage output O001 is transferred to the test signal output terminal 313, and then, the first analog voltage output O001 appears on the test signal output lead 22 of TFT source driver device.

Next, in response to the second clock pulse CP, the 192-bit shift register 311 shifts its data stored therein, and makes the 001-bit output change to "0" or "the L level", and makes only the 002-bit output change to "1" or "the H level". Thus, the first switch S001 turns off, and only the second switch S002 turns on. Other switches S003-S384 are maintained in off state.

Thus, by turning the second switch S002 on, only the third analog voltage output O003 is outputted to the test signal output terminal 313 of the test circuit 3000 via the second switch S002. As well as the first analog voltage output O001, the third analog voltage output O003 appears on the test signal output lead 22, instead of the first analog voltage output O001.

As well as the operation described above, since the 192-bit shift register 311 shifts its data stored therein in response to the clock pulse CP inputted sequentially, the 192-bit shift register 311 makes its 003-bit output through its 192-bit output changed to "1" or "the H level", selectively and sequentially, in response to the clock pulse CP. As well as the operation described above, while one of 192 outputs from the 192-bit shift register 311 is in the H level, other 191 outputs is in the L level. Thus, one of the switches S003-S192 turns on, selectively and sequentially, in response to one having the H level of the 192 outputs so that one of the odd-bit analog voltage outputs O001, O003 . . . O381, O383 outputted from the output circuit 107 is outputted to the test signal output terminal 313 of the test circuit 3000 sequentially via one of the switches S003-S192, and then, the add analog voltage output on the test signal output terminal 313 appears on the test signal output lead 22.

After the analog voltage output signal O383 appears on the test signal output lead 22 by turning the 192nd switch S192 on, the voltage level of the output polarity signal POL is changed from the L to the H. Thus, each decoded output N is outputted as the analog voltage output O(2n−1). In the first signal switching circuits 350, since the second analog voltage signal O002 is inputted as the decoded signal N, the second analog voltage signal O002 is outputted for the output circuit 308 to the first analog voltage output terminal OT001.

As well as the first signal switching circuit 350, the second through 94th signal switching circuits 350 output the even-bit analog voltage outputs O002, O004 . . . O382, O384 to the odd output terminal OT003, OT005 . . . OT381, OT 383.

Since the 192 bit shift register is reset after the level of the output polarity signal POL is changed from the L to the H, only the first switch S001 turns on in response to the next clock pulse CP and the 192nd switch S384 turns off. Thus, although all even-bit analog voltage outputs O(2n) appeared on the odd output terminals OT003, OT005 . . . OT381, OT 383 are inputted to the first through 192nd switches S001-S192 simultaneously, since only the first switch S001 is turning on, the second analog voltage output O002 is transferred to the test signal output terminal 313, and then, the second analog voltage output O002 appears on the test signal output lead 22 of TFT source driver device.

Next, in response to the second clock pulse CP, the 192-bit shift register 311 shifts its data stored therein, and makes the 001-bit output change to "0" or "the L level", and makes only the 002-bit output change to "1" or "the H level". Thus, the first switch S001 turns off, and only the second switch S002 turns on. Other switches S003-S384 are maintained in off state.

Thus, by turning the second switch S002 on, only the fourth analog voltage output O004 is outputted to the test signal output terminal 313 of the test circuit 3000 via the second switch S002. As well as the second analog voltage output O002, the fourth analog voltage output O004 appears on the test signal output lead 22, instead of the second analog voltage output O002.

As well as the operation described above, since the 192-bit shift register 311 shifts its data stored therein in response to the clock pulse CP inputted sequentially, the 192-bit shift register 311 makes its 003-bit output through its 192-bit output changed to "1" or "the H level", selectively and sequentially, in response to the clock pulse CP. As well as the operation described above, while one of 192 outputs from the 192-bit shift register 311 is in the H level, other 191 outputs is in the L level. Thus, one of the switches S003-S192 turns on, selectively and sequentially, in response to one having the H level of the 192 outputs so that one of the even-bit analog voltage outputs on the odd output terminals OT003, OT005 . . . OT381, OT 383 is outputted to the test signal output terminal 313 of the test circuit 3000, selectively and sequentially, via one of the switches S003-S192, and then, the add analog voltage output on the test signal output terminal 313 appears on the test signal output lead 22.

According to the third embodiment, the odd-bit analog voltage outputs O(2n−1) on the odd output terminals OT003, OT005 . . . OT381, OT 383 are outputted to the test signal output terminal 313, selectively and sequentially, and then, the even-bit analog voltage outputs O(2n) on the same terminals, that is the odd output terminals OT003, OT005 . . . OT381, OT 383, are outputted to the test signal output terminal 313, selectively and sequentially. Thus, in addition to the benefits of the first and second embodiments, the bit number of the shift register 311 reduced in half in comparison with the shift register 11 used in the first embodiment, and a number of the switch can be reduced in half in comparison with the number of the switches used in the first and second embodiments while the signal switching circuits 350 having the small and simple structures are added in the output circuit 308. Thus, the chip size can be reduced dramatically.

While the invention has been described with reference to illustrative embodiments, this description is not intended to be construed in a limiting sense. For example, although the shift register 11, 211, 311 in the test circuit in the first through third embodiment are enabled in response to the test enable signal TEST EN, and its data stored therein is shifted in response to the clock pulse CP, another type of a shift register having a reset or a set function may be formed instead of the shift register 11, 211, 311. In this case, an operation clock for this type of the shift register having the reset or set function may be inputted from the test signal input terminal 12, 212, 312. According to this structure, the operation clock is not inputted there in order to let the LSI chip be in operation mode, and is inputted there in order to let the LSI chip be in test mode. In the operation mode, the outputs of all bits from the shift register are reset or set. In the test mode, one output having the H level is shifted from the first bit to its upper bit in response to the operation clock. Thus, the similar operation in the first through third embodiment can be expected to this type of the shift register having the reset or set function. Further, a dummy bit can be formed at the first bit or the last bit of the shift register having the reset or set function. In this case, only one bit having the H level is held at the dummy bit in the operation mode, then, when the mode is changed from the operation to the test, the only one output having the H level is shifted from the dummy bit to its upper bit in response to the operation clock.

Further, an analog voltage output circuit (HV circuit) of the TFT source driver generally outputs the high voltage around 10V, and its analog voltage input circuit (LV circuit) is operated by voltage around 3-5V. Although the shift register 11, 211, 311 and the switches S001-S192 or S001-S384 in the test circuit in the first through third embodiment may be formed in the HV circuit, the shift register should be formed in the LV circuit, and the switches should be formed in the HV circuit. By forming the shift register and the switches in the different circuits LV, HV, one of them may not be large enough. In this case, since it is necessary to change the voltage level of the bit output of the shift register in the LV circuit to the voltage level for switching the on/off condition of the switches in the HV circuit, a voltage level shift circuit should be inserted at each node.

Moreover, the test signal input lead 21, the test signal output lead 22 and the first and second test signal output leads 222A, 222B in the user area 201 are changed in any desired shapes which are suitable for contacting the needle of the manipulator. This invention can be used for any LSI chip having multiple outputs. However, this invention is especially useful for an analog voltage output driver LSI chip because it has so many outputs, comparing to other LSI chips. Various other modifications of the illustrated embodiment will be apparent to those skilled in the art on reference to this description. Therefore, the appended claims are intended to cover any such modifications or embodiments as fall within the true scope of the invention.

The invention claimed is:

1. A semiconductor device, comprising:

a carrier including a plurality of input leads, a plurality of output leads and a single test signal output lead; and a rectangular-shaped voltage output driver LSI chip, which is mounted on the carrier, including a plurality of input terminals, a plurality of output terminals, a plurality of switch circuits and a single test signal output terminal, which is commonly connected to the output terminals via respective ones of the switch circuits, the voltage output driver LSI chip having a first side and a second side, which is arranged opposite to the first side, wherein each of the input leads is electrically connected to one of the input terminals, each of the output leads is electrically connected to one of the output terminals and the single test signal output lead is electrically connected to the single test signal output terminal, and wherein the input leads and the single test signal output lead are disposed along the first side of the LSI chip, the output leads are disposed along the second side of the LSI chip.

2. A semiconductor device as claimed in claim 1, wherein a number of the input leads is less than that of the output leads.

3. A semiconductor device as claimed in claim 1, wherein a width of each input lead is wider than that of each output lead.

4. A semiconductor device as claimed in claim 1, wherein the carrier is formed of one of a tape and a film.

* * * * *